(12) United States Patent
Kim et al.

(10) Patent No.: US 10,319,419 B2
(45) Date of Patent: Jun. 11, 2019

(54) SEMICONDUCTOR MEMORY DEVICE, AND SIGNAL LINE LAYOUT STRUCTURE THEREOF

(71) Applicant: SK hynix Inc., Gyeonggi-do (KR)

(72) Inventors: Jong-Su Kim, Gyeonggi-do (KR); Yeon-Gul Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 1 day.

(21) Appl. No.: 15/665,484

(22) Filed: Aug. 1, 2017

(65) Prior Publication Data

US 2018/0166108 A1      Jun. 14, 2018

(30) Foreign Application Priority Data

Dec. 9, 2016   (KR) .......................... 10-2016-0167616

(51) Int. Cl.
| | |
|---|---|
| *G11C 7/10* | (2006.01) |
| *G11C 5/02* | (2006.01) |
| *G11C 7/08* | (2006.01) |
| *G11C 5/06* | (2006.01) |

(52) U.S. Cl.
CPC .............. *G11C 7/1051* (2013.01); *G11C 5/02* (2013.01); *G11C 5/025* (2013.01); *G11C 5/063* (2013.01); *G11C 7/1048* (2013.01); *G11C 7/1069* (2013.01); *G11C 7/1078* (2013.01); *G11C 7/08* (2013.01); *G11C 7/10* (2013.01); *G11C 2207/105* (2013.01)

(58) Field of Classification Search
CPC ......... G11C 7/1051; G11C 5/025; G11C 7/08; G11C 7/1048; G11C 7/1069; G11C 7/1078
See application file for complete search history.

(56) References Cited

U.S. PATENT DOCUMENTS

| | | | | |
|---|---|---|---|---|
| 6,314,042 | B1 * | 11/2001 | Tomishima | G11C 7/1006 365/230.03 |
| 6,452,862 | B1 * | 9/2002 | Tonnotani | G11C 8/10 365/203 |
| 6,646,946 | B2 * | 11/2003 | Tomishima | G11C 7/1006 365/230.03 |

(Continued)

FOREIGN PATENT DOCUMENTS

| | | |
|---|---|---|
| KR | 1020030062086 | 7/2003 |
| KR | 100871083 | 11/2008 |

*Primary Examiner* — Tri M Hoang
(74) *Attorney, Agent, or Firm* — IP & T Group LLP (57) ABSTRACT

A memory device includes first and second memory blocks each including a memory cell array, a sub-word line drive region and a bit line sense amplifier region corresponding to the memory cell array, first and second data transmission lines disposed in the bit line sense amplifier region of each memory block, wherein the first and second data transmission lines extend on an identical row and transmit data of the memory cell array of the memory block, a row decoder configured to select one of the first and second memory blocks in response to a row address and enable a word line of the memory cell array included in the selected memory block, and a column decoder configured to generate, in response to a column address, first and second column select signals corresponding to the first and second data transmission lines of the bit line sense amplifier region.

17 Claims, 5 Drawing Sheets

(56) References Cited

U.S. PATENT DOCUMENTS

| 2011/0026290 A1* | 2/2011 | Noda | G11C 5/025 |
| | | | 365/51 |
| 2013/0193507 A1* | 8/2013 | Yoshida | G11C 11/4091 |
| | | | 257/329 |

\* cited by examiner

SEMICONDUCTOR MEMORY DEVICE, AND SIGNAL LINE LAYOUT STRUCTURE THEREOF

CROSS-REFERENCE TO RELATED APPLICATION

This application claims priority under 35 U.S.C. § 119 to Korean Patent Application No. 10-2016-0167616 filed on Dec. 9, 2016 in the Korean Intellectual Property Office, the disclosure of which is incorporated herein by reference in its entirety.

TECHNICAL FIELD

Exemplary embodiments of the present disclosure relate to a semiconductor memory device, and more particularly, to a signal line layout structure for inputting/outputting data of a semiconductor memory device.

DISCUSSION OF THE RELATED ART

Generally, a semiconductor memory device may be divided into a core region including a memory bank, a row decoder, a column decoder, etc., and a peripheral region including a pad, a power supply circuit, a delay locked loop, etc.

Figure 1:
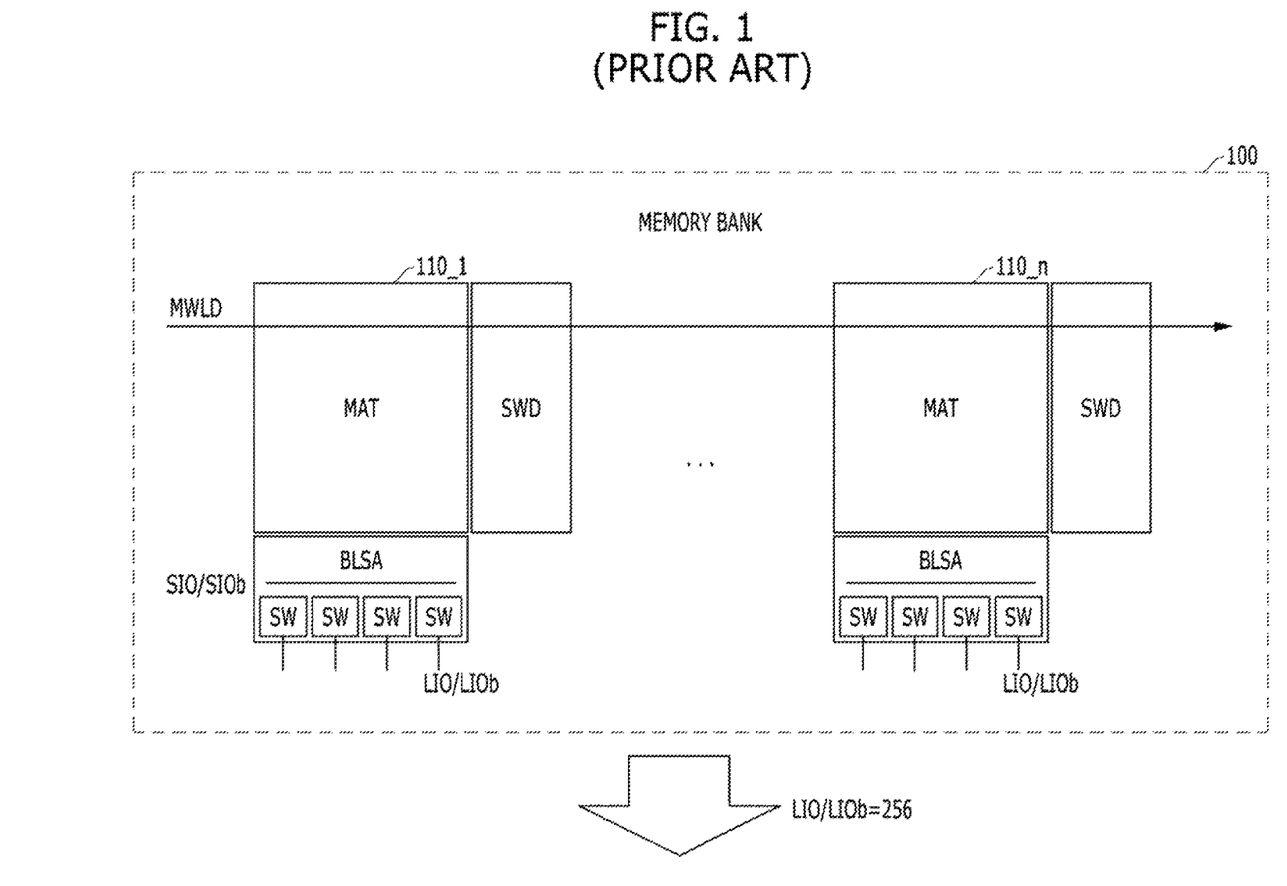
FIG. 1 is a block diagram illustrating a structure of a memory bank of a conventional memory device.

FIG. 1 is a block diagram illustrating a structure of a memory bank 100 of a conventional memory device.

Referring to FIG. 1, the memory bank 100 is disposed in a core region of the memory device. The memory bank 100 of the conventional memory device includes a plurality of cell arrays MAT 110_1 to 110_n, each of which includes memory cells. Each of the cell arrays 110_1 to 110_n is separated by a sub-word line drive region SWD and a bit line sense amplifier region BLSA.

A read operation of the conventional semiconductor memory device having the above-mentioned configuration will be described. If one main word line drive signal MWLD is selected to activate a certain main word line by a row address, word lines corresponding to the activated main word line, which are disposed in the respective cell arrays 110_1 to 110_n, are enabled by a sub-word line driver (not shown) disposed in the sub-word line drive region SWD. Data stored in memory cells coupled to each enabled word line are transmitted to bit lines and sensed/amplified by bit line sense amplifiers (not shown) disposed in the bit line sense amplifier region BLSA.

Here, data transmission lines SIO/SIOb are disposed in the bit line sense amplifier region BLSA, so that the data sensed/amplified by the bit line sense amplifiers are transmitted to the data transmission lines SIO/SIOb. The data transmitted to the data transmission line SIO/SIOb may be transmitted to data input/output lines LIO/LIOb by a switch SW which is enabled by a column address, and then be outputted to an external device.

For example, in the case of the memory device of FIG. 1 having double data rate 3 (DDR3) or DDR4 configuration of x8 data pads DQ, the memory bank 100 may include 256 data input/output lines LIO/LIOb. When the memory bank 100 includes sixteen cell arrays 110_1 to 110_n which are coupled in parallel with each other, 16 data input/output lines LIO/LIOb may be allocated to each of sixteen cell arrays 110_1 to 110_n. Respective word lines of the sixteen cell arrays 110_1 to 110_n may be simultaneously enabled by a single word line drive operation.

As described above, data stored in memory cells coupled to enabled word lines are sensed/amplified by the bit line sense amplifiers. In the case where the size of data sensed/amplified by a single word line drive operation is defined as a page size, as the page size is increased, the area of the memory device may be optimized, and the number of net dies may be increased. However, because the number of bit line sense amplifiers which should be operated is increased by the increase in the page size, operating current of the memory device is also increased.

On other hand, if the page size is reduced, the area of the memory device or the number of data lines is accordingly increased so that supply of power to the memory device may weaken. Therefore, developing a memory device capable of reducing the operating current without a substantial increase in the area of the memory device would be desirable.

SUMMARY

Various embodiments of the present invention are directed to a semiconductor memory device. The semiconductor memory device may retain a bandwidth of data inputted/outputted without an increase in the area of the semiconductor memory device. The semiconductor memory device may employ a reduced page size by dividing a memory bank into two or more regions. The semiconductor device may operate with a reduced operating current.

In accordance with an embodiment of the present invention, a memory device includes: first and second memory blocks each including at least one memory cell array, a sub-word line drive region and a bit line sense amplifier region corresponding to the at least one memory cell array; first and second data transmission lines disposed in the bit line sense amplifier region of each memory block, wherein the first and second data transmission lines extend on an identical row and transmit data of the memory cell array of the memory block; a row decoder configured to select one of the first and second memory blocks in response to a row address and enable a word line of the memory cell array included in the selected memory block; and a column decoder configured to generate, in response to a column address, first and second column select signals corresponding to the first and second data transmission lines of the bit line sense amplifier region included in the selected memory block.

In accordance with an embodiment of the present invention, a memory device includes: first and second memory blocks each including at least one memory cell array defined by a sub-word line driver region and a bit line sense amplifier region; first and second data transmission lines disposed in the bit line sense amplifier region, and extending in an identical row; and first and second bit line sense amplifiers disposed in the bit line sense amplifier region and configured to sense/amplify data of the memory cell array and transmit the data to the first and second data transmission lines, respectively, wherein the first and second bit line sense amplifiers are selectively enabled according to a column address.

DETAILED DESCRIPTION

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The terminology used herein is for the purpose of describing particular embodiments only and is not intended to be limiting of the inventive concept. As used herein, singular forms are intended to include the plural forms as well, unless the context clearly indicates otherwise. It will be further understood that the terms "comprises," "comprising," "includes," and/or "including" when used in this specification, indicate the presence of stated features, but do not preclude the presence or addition of one or more other features. As used herein, the term "and/or" indicates any and all combinations of one or more of the associated listed items.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Figure 2:
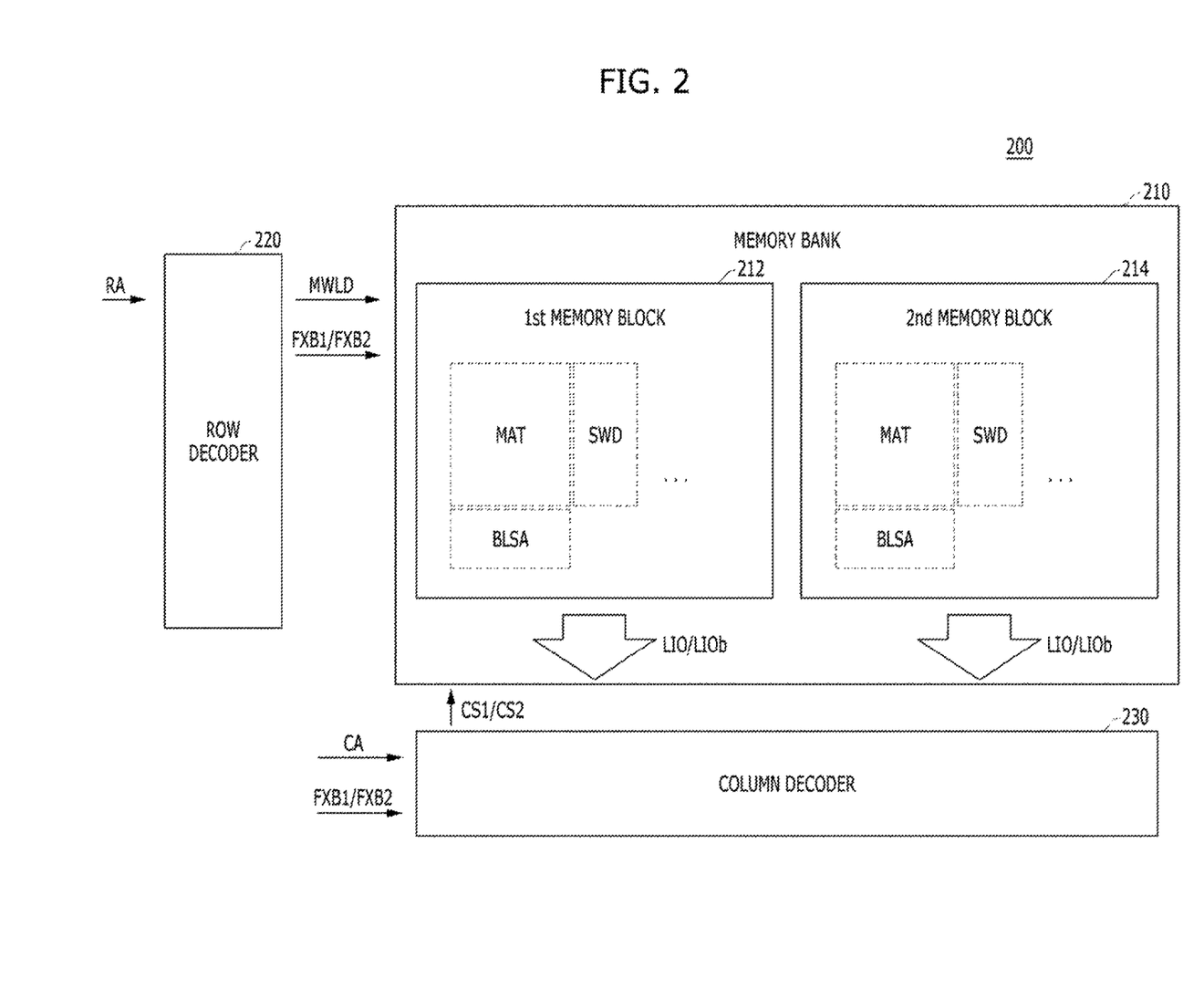
FIG. 2 is a block diagram illustrating a structure of a memory device in accordance with an embodiment of the present invention.

FIG. 2 is a block diagram illustrating a structure of a memory device in accordance with an embodiment of the present invention.

The memory device 200 may include a plurality of memory banks each of which is independently accessible by a host (not shown), e.g., a central processing unit. FIG. 2 illustrates one representative memory bank 210 of the plurality of memory banks. The memory device 200 may include a memory bank 210, a row decoder 220 and a column decoder 230, which correspond to the memory bank 210.

Word lines and bit lines, which perpendicularly intersect with each other, are disposed on the memory bank 210. Memory cells for storing data are disposed on respective intersection regions. Here, to reduce signal delay due to the resistance characteristics of the material, for example, polysilicon, which may be used as material of the word lines, a hierarchical word line structure may be formed by dividing the word lines into main word lines and sub-word lines. Therefore, the memory bank 210 may include a plurality of minimum-unit memory cell arrays MAT which are divided both by a sub-word line drive region SWD including sub-word line drivers (not shown) for driving the sub-word lines and by a bit line sense amplifier region BLSA including bit line sense amplifiers (not shown) for sensing/amplifying data.

In accordance with an embodiment, the memory bank 210 may be divided into two or more memory blocks. Each of the memory blocks may be independently operated by the row decoder 220 and include one or more memory cell arrays MAT. Referring to FIG. 2, the memory bank 210 may include first and second memory blocks 212 and 214 each of which includes at least one memory cell array MAT.

The row decoder 220 may select one of the first and second memory blocks 212 and 214 of the memory bank 210 in response to a row address RA inputted from the host, and enable word lines of the memory cell arrays MAT included in the selected memory block. To achieve this, the row decoder 220 may decode the row address RA and generate first and second select signals FXB1 and FXB2 that respectively correspond to the first and second memory blocks 212 and 214.

In accordance with an embodiment, the row decoder 220 may enable one main word line drive signal MWLD corresponding to all of the memory cell arrays MAT included in the memory bank 210 regardless of selecting one of the first and second memory blocks 212 and 214. Further, the row decoder 220 may enable a sub-word line drive signal, that is, the first or second select signal FXB1 or FXB2 to select one of the first or second memory block 212 or 214.

Although not shown in FIG. 2, in accordance with another embodiment, the row decoder 220 may enable main word line drive signals respectively corresponding to the first and second memory blocks 212 and 214. In this case, the main word line drive signals may be used as the first and second select signals by the column decoder 230.

The column decoder 230 may generate first and second column select signals CS1 and CS2 of the selected memory block from the first and second memory blocks 212 and 214 in response to a column address CA. For this, the column decoder 230 may decode the column address CA according to the first and second select signals FXB1 and FXB2, and generate the first and second column select signals CS1 and CS2 of the selected memory block from the first and second memory blocks 212 and 214.

That is, in accordance with an embodiment, if one memory block of the first and second memory blocks 212 and 214 is selected by the row decoder 220 and the word lines of the corresponding memory cell arrays MAT included in the selected memory block are enabled, the column decoder 230 may generate the first and second column select signals CS1 and CS2 corresponding to the selected memory block so as to input or output data of memory cells coupled to the enabled word lines. Therefore, each of the first and second memory blocks 212 and 214 may have a data input/output line structure corresponding to one memory bank 210.

For example, for data transmission in DDR3/DDR4 configuration of x8 data pads DQ, the one memory bank 210 may include 256 data input/output lines LIO/LIOb. In accordance with an embodiment, each of the first and second memory blocks 212 and 214 may include dedicated data input/output lines LIO/LIOb, that is, 256 data input/output lines LIO/LIOb. When the memory bank 210 includes sixteen memory cell arrays MAT, each of the first and second memory blocks 212 and 214 may include eight memory cell arrays MAT that is less than that of the memory bank 210. Thus, the increased number of data input/output lines LIO/LIOb may be allocated to the memory cell arrays MAT of the first and second memory blocks 212 and 214, and a signal line configuration of the memory cell arrays MAT of the first and second memory blocks 212 and 214 has to be changed. Signal line layout of a memory cell array MAT in accordance with an embodiment will be described in detail with reference to FIG. 3.

Figure 3:
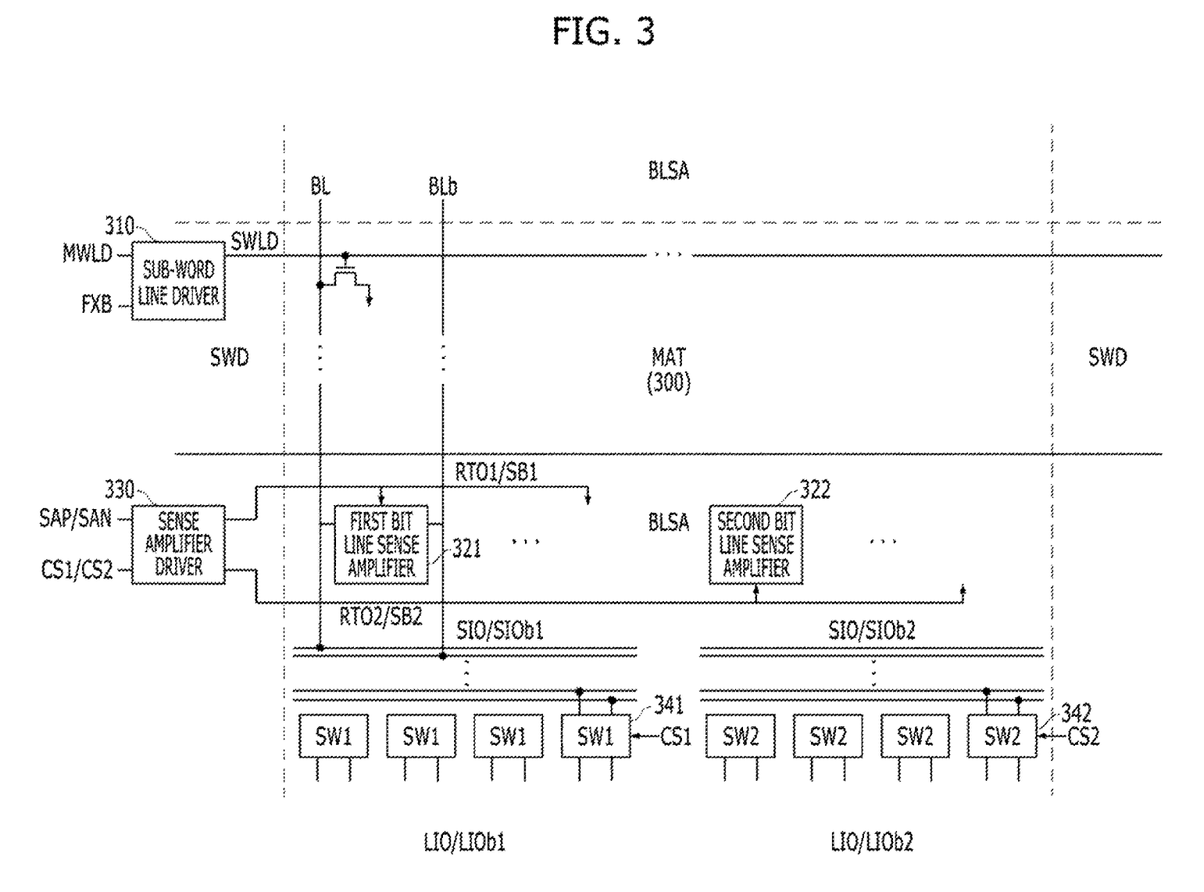
FIG. 3 is a detailed diagram illustrating an exemplary configuration of a memory cell array shown in FIG. 2.

FIG. 3 is a detailed diagram illustrating a memory cell array shown in FIG. 2. FIG. 3 illustrates one representative memory cell array 300 of the plurality of memory cell arrays MAT included in the memory bank 210.

Although not shown in FIG. 2, as shown in FIG. 3, the one memory cell array 300 may be enclosed at left and right sides and upper and lower sides thereof by sub-word line drive regions SWD and bit line sense amplifier regions BLSA, respectively. The memory cell array 300 may share each region with an adjacent memory cell array MAT. That is, the plurality of memory cell arrays MAT may be divided and defined by the sub-word line drive regions SWD and the bit line sense amplifier regions BLSA.

FIG. 3 illustrates a detailed configuration of only a lower bit line sense amplifier region BLSA of the memory cell array 300. It is noted, however, that upper and lower bit line sense amplifier regions BLSA may have the same configuration. Therefore, only the lower bit line sense amplifier region BLSA will be described as a representative example.

In accordance with an embodiment, data transmission lines SIO/SIOb, e.g., segment input/output lines, for transmitting data of the memory cell array 300 may be disposed on the bit line sense amplifier region BLSA in a state in which the data transmission lines SIO/SIOb are separated, at central portions thereof, into two parts. That is, the data transmission lines SIO/SIOb may include first and second data transmission lines SIO/SIOb1 and SIO/SIOb2 which extend on the same rows. The first and second data transmission lines SIO/SIOb1 and SIO/SIOb2 may be disposed in a row along one side of the memory cell array 300 and thus have a symmetrical structure based on a center of the corresponding side of the memory cell array 300.

Word lines of the memory cell array 300 may be enabled by a sub-word line driver 310 disposed in the sub-word line drive region SWD. The sub-word line driver 310 may generate a sub-word line drive signal SWLD in response to a main world line drive signal MWLD and a corresponding select signal FXB of first and second select signals FXB1 and FXB2 (of FIG. 2). The word lines of the memory cell array 300 may be enabled in response to the sub-word line drive signal SWLD. The sub-word line driver 310 will be described in more detail later herein with reference to FIG. 4.

Data of memory cells coupled to the enabled word line of the memory cell array 300 may be sensed/amplified by bit line sense amplifiers disposed in the bit line sense amplifier region BLSA. For example, a plurality of bit line sense amplifiers may be disposed in a two-stage structure in the bit line sense amplifier region BLSA. The bit line sense amplifiers are coupled between bit lines BL and BLb and data transmission lines SIO/SIOb. In accordance with an embodiment, the bit line sense amplifiers may include first and second bit line sense amplifiers 321 and 322 respectively corresponding to first and second data transmission lines SIO/SIOb1 and SIO/SIOb2.

The first and second bit line sense amplifiers 321 and 322 may be driven by a sense amplifier driver 330 disposed in an intersection region between the word line drive region SWD and the bit line sense amplifier region BLSA. The sense amplifier driver 330 may generate first sense amplifier power line signals RTO1/SB1 and second sense amplifier power line signals RTO2/SB2 which respectively correspond to first and second bit line sense amplifiers 321 and 322 in response to sense amplifier enable signals SAP and SAN and first and second column select signals CS1 and CS2.

The column decoder 230 may decode a column address CA and selectively generate the first and second column select signals CS1 and CS2. That is, depending on a burst length of data inputted or outputted from the memory device 200, both or either of the first and second column select signals CS1 and CS2 may be enabled. Accordingly, the sense amplifier driver 330 selectively drives the first and second bit line sense amplifiers 321 and 322, thus reducing the amount of current consumed in the memory device 200. The sense amplifier driver 330 will be described in more detail with reference to FIG. 5.

The first and second data transmission lines SIO/SIOb1 and SIO/SIOb2 may be respectively coupled to first and second data input/output lines LIO/LIOb1 and LIO/LIOb2, e.g., local input/output lines via respective switches 341, 342. First and second input/output switches 341 and 342 may respectively couple the first and second data transmission lines SIO/SIOb1 and SIO/SIOb2 to the first and second data input/output lines LIO/LIOb1 and LIO/LIOb2, in response to the first and second column select signals CS1 and CS2. The first and second input/output switches 341 and 342 may be disposed in the bit line sense amplifier region BLSA. At this time, the number of the first and second input/output switches 341 and 342 is twice as that of the switches SW of FIG. 1.

As described above, the memory bank may be divided into two or more regions. When a single active operation, that is, a single word line drive operation, is performed, only word lines corresponding to a selected memory block of the memory bank may be enabled. Therefore, since an operation of bit line sense amplifiers corresponding to the unselected memory block of the memory bank may be omitted, required operating current may be reduced. Instead, the bandwidth of inputted or outputted data may be maintained, without an increase in the number of signal lines, by dividing the data transmission line SIO/SIOb disposed in the bit line sense amplifier region BLSA and increasing the number of corresponding switches SW. Furthermore, current to be consumed in the memory device according to the bandwidth of data may be reduced by selectively driving the bit line sense amplifiers corresponding to the divided data transmission lines SIO/SIOb.

Figure 4:
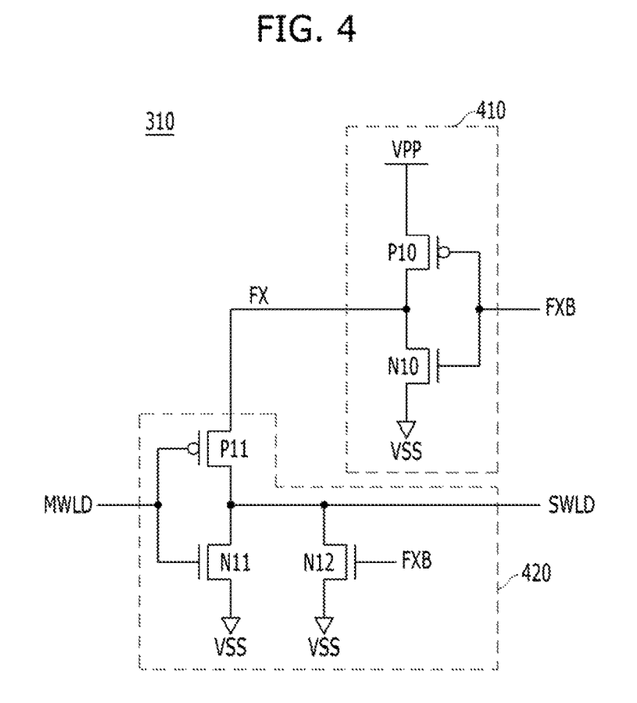
FIG. 4 is a circuit diagram illustrating an exemplary configuration of a sub-word line driver shown in FIG. 3.

FIG. 4 is a circuit diagram illustrating an exemplary configuration of the sub-word line driver 310 shown in FIG. 3.

The sub-word line driver 310 may include a select unit 410 and a drive unit 420.

The select unit 410 may invert and drive a select signal FXB and generate an inverted select signal FX. The select unit 410 may include a PMOS transistor P10, and an NMOS transistor N10. The PMOS transistor P10 and the NMOS transistor N10 may be coupled in series between a pumping voltage terminal VPP and a ground voltage terminal VSS. The PMOS transistor P10 and the NMOS transistor N10 may receive the select signal FXB through a common gate terminal.

The drive unit 420 may receive the inverted select signal FX as a pull-up power supply, invert and drive a main word line drive signal MWLD, and thus generate a sub-word line drive signal SWLD. The drive unit 420 may include a PMOS transistor P11, and NMOS transistors N11 and N12.

The PMOS transistor P11 and the NMOS transistor N11 are coupled in series between a pull-up power supply terminal for receiving the inverted select signal FX and the ground voltage terminal VSS. The PMOS transistor P11 and the NMOS transistor N11 may receive the main word line drive signal MWLB through a common gate terminal. The NMOS transistor N12 is coupled between an output terminal for the sub-word line drive signal SWLD and the ground voltage terminal VSS. The NMOS transistor N12 may receive the select signal FXB through a gate terminal. In the case where a row address RA is decoded by the row decoder 220 so that both the select signal FXB and the main word line drive signal MWLB are enabled to a low level, the sub-word line driver 310 may enable the sub-word line drive signal SWLD to a high level and output it.

Figure 5:
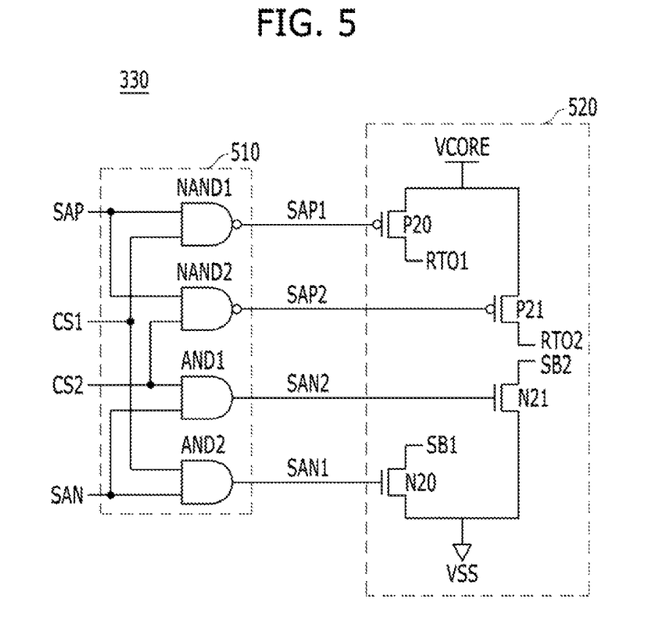
FIG. 5 is a circuit diagram illustrating an exemplary configuration of a sense amplifier driver shown in FIG. 3.

FIG. 5 is a circuit diagram illustrating an exemplary configuration of the sense amplifier driver 330 shown in FIG. 3.

The sense amplifier driver 330 may include a drive signal generation unit 510 and a drive unit 520.

The drive signal generation unit 510 may generate first sense amplifier drive signals SAP1/SAN1 and second sense amplifier drive signals SAP2/SAN2 which respectively correspond to the first and second bit line sense amplifiers 321 and 322, by combining sense amplifier enable signals SAP and SAN and first and second column select signals CS1 and CS2 with each other. The drive signal generation unit 510 may include NAND gates NAND1 and NAND2, and gates AND1 and AND2.

If the sense amplifier enable signals SAP and SAN are enabled, the drive signal generation unit 510 may enable the first sense amplifier drive signals SAP1/SAN1 in response to the first column select signal CS1, and enable the second sense amplifier drive signals SAP2/SAN2 in response to the second column select signal CS2. That is, the drive signal generation unit 510 may enable ones of the first sense amplifier drive signals SAP1/SAN1 and the second sense amplifier drive signals SAP2/SAN2 according to the enabling of the respective column select signals CS1 and CS2.

The drive unit 520 may include PMOS transistors P20 and P21, and NMOS transistors N20 and N21. The PMOS transistors P20 and P21 have gate terminals respectively receiving the first and second sense amplifier drive signals SAP1 and SAP2, source terminals coupled to a core voltage terminal VCORE, and drain terminals respectively coupled to output terminals for first and second sense amplifier power line signals RTO1 and RTO2. The NMOS transistors N20 and N21 have gate terminals respectively receiving the first and second sense amplifier drive signals SAN1 and SAN2, source terminals coupled to a ground voltage terminal VSS, and drain terminals respectively coupled to output terminals for first and second sense amplifier power line signal SB1 and SB2.

Therefore, when the first column select signal CS1 is enabled and the first sense amplifier drive signals SAP1 and SAN1 are respectively enabled to a low level and a high level, the PMOS and NMOS transistors P20 and N20 are turned on, so that the first sense amplifier power line signals RTO1 and SB1 respectively having a core voltage and a ground voltage may be supplied to the first bit line sense amplifiers 321. Likewise, when the second column select signal CS2 is enabled, the PMOS and NMOS transistors P21 and N21 are turned on, so that the second sense amplifier power line signals RTO2 and SB2 respectively having the core voltage and the ground voltage may be supplied to the second bit line sense amplifiers 322. When both of the first and second column select signals CS1 and CS2 are enabled, the first sense amplifier power line signals RTO1 and SB1 and the second sense amplifier power line signals RTO2 and SB2 may be respectively supplied to the first bit line sense amplifiers 321 and the second bit line sense amplifiers 322. Therefore, according to the first and second column select signals CS1 and CS2, the sense amplifier power line signals may be supplied to both or either of the first and second bit line sense amplifiers 321 and 322.

Figure 6:
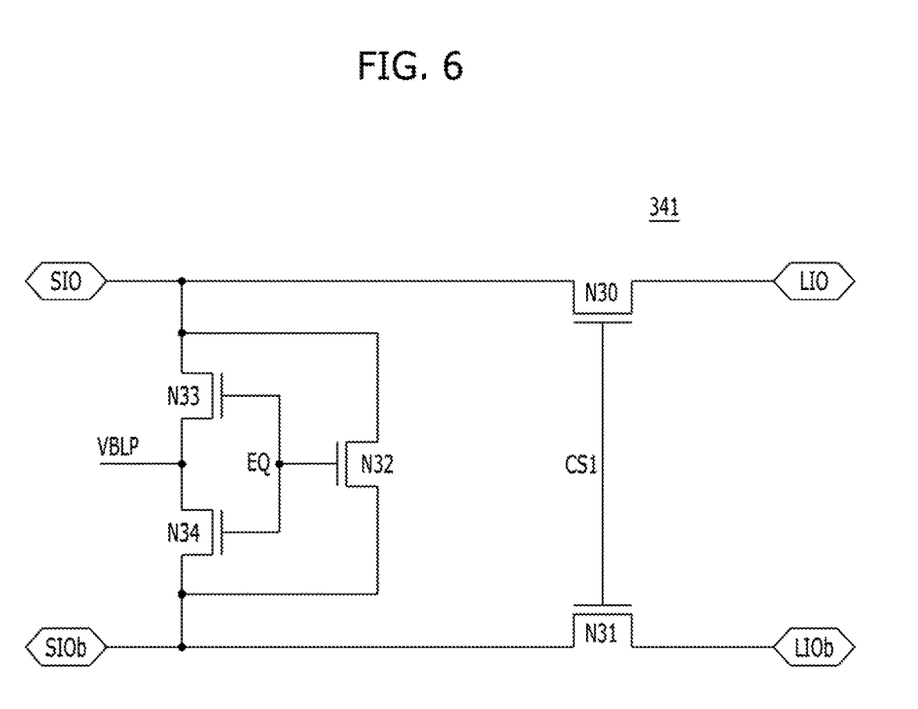
FIG. 6 is a circuit diagram illustrating an exemplary configuration of an input/output switch shown in FIG. 3.

FIG. 6 is a circuit diagram illustrating an exemplary configuration of an input/output switch shown in FIG. 3. Since the first and second input/output switches 341 and 342 of FIG. 3 may have the same configuration, the configuration of only one switch 341 is representatively illustrated in FIG. 5.

The first input/output switch 341 for coupling the data transmission lines SIO and SIOb to the data input/output lines LIO and LIOb may include select transistors N30 and N31 which are coupled between the corresponding lines. In addition, the switch may further include equalizing and precharging transistors N32 to N34 for equalizing or precharging the corresponding data transmission lines SIO/SIOb.

The equalizing transistor N32 may be configured to equalize the data transmission lines SIO and SIOb provided in pair, and may be coupled between the data transmission lines SIO and SIOb. The precharging transistors N33 and N34 may be provided to precharge the data transmission lines SIO and SIOb to a certain voltage, e.g., a precharging voltage VBLP. The precharging transistors N33 and N34 may be coupled in series between the data transmission lines SIO and SIOb, and the precharging voltage VBLP may be supplied to a connecting portion therebetween.

In FIG. 6, there has been illustrated an example in which the equalizing transistor N32 and the precharging transistors N33 and N34 are driven by the same signal, e.g., an equalizing signal EQ, but this is one embodiment of the present disclosure. In accordance with another embodiment, the equalizing transistor N32 and the precharging transistors N33 and N34 may be driven by respective signals, e.g., an equalizing signal EQ and a precharging signal (not shown).

The select transistors N30 and N31 may be driven by a first column select signal CS1 outputted from the column decoder 230 and thus couple the data transmission lines SIO and SIOb to the data input/output lines LIO and LIOb. As described above, the first and second switches 341 and 342 may be respectively driven by the first and second column select signals CS1 and CS2 and thus respectively couple the data transmission lines SIO and SIOb to the data input/output lines LIO and LIOb.

In a semiconductor memory device in accordance with an embodiment, a memory bank may be divided into two or more regions so that the size of data to be sensed/amplified by a single active operation may be reduced. Therefore, operating current of the semiconductor memory device may be reduced by reducing use of bit line sense amplifiers for sensing/amplifying data.

Furthermore, to compensate for a reduction in the size of data sensed/amplified, data transmission lines are configured in such a way that they are separated into a plurality of parts, so that the bandwidth of inputted/outputted data may be maintained without an increase in the number of data transmission lines. Bit line sense amplifiers corresponding to the separated data transmission lines may be selectively driven depending on a bandwidth of data, so that current consumption in the semiconductor memory device may be additionally reduced.

Although various embodiments have been described for illustrative purposes, it will be apparent to those skilled in the art that various changes and modifications may be made without departing from the spirit and scope of the disclosure as defined in the following claims.

What is claimed is:

1. A memory device comprising:
    first and second memory blocks, each including a memory cell array, a sub-word line drive region and a bit line sense amplifier region corresponding to the memory cell array;
    first and second data transmission lines disposed and extending on an identical row in the bit line sense amplifier region of the memory cell array, wherein the first and second data transmission lines transmit data of the memory cell array of the memory block;
    a row decoder configured to select one of the first and second memory blocks in response to a row address and enable a word line of the memory cell array included in the selected memory block;
    a column decoder configured to generate, in response to a column address, first and second column select signals corresponding to the first and second data transmission lines of the bit line sense amplifier region of the memory cell array included in the selected memory block; and
    a sense amplifier driver comprising:
        a drive signal generation unit configured to generate first and second drive signals respectively corresponding to first and second bit line sense amplifiers by combining a bit line sense amplifier enable signal with the first and second column select signals, and
        a drive unit configured to provide power line signals to the first and second bit line sense amplifiers in response to the first and second drive signals, respectively.

2. The memory device of claim 1, wherein the first and second data transmission lines form a symmetrical structure based on a center of one side of the memory cell array.

3. The memory device of claim 2, wherein the first and second data transmission lines are disposed in a row along the side of the memory cell array.

4. The memory device of claim 1, wherein:
    the first and second bit line sense amplifiers are disposed in the bit line sense amplifier region of each memory block and configured to sense/amplify the data of the memory cell array of the memory block and transmit the sensed/amplified data to the first and second data transmission lines, respectively.

5. The memory device of claim 4, wherein:
    the sense amplifier driver is configured to drive the first and second bit line sense amplifiers in response to the first and second column select signals and the bit line sense amplifier enable signal.

6. The memory device of claim 1, further comprising:
    first and second input/output switches disposed in the bit line sense amplifier region and coupled between the first and second data transmission lines and data input/output lines corresponding to the first and second data transmission lines.

7. The memory device of claim 6, wherein the first and second input/output switches respectively couple the first and second data transmission lines to the corresponding data input/output lines in response to the first and second column select signals.

8. The memory device of claim 6, wherein the first and second data transmission lines and the data input/output lines respectively include segment input/output lines and local input/output lines.

9. The memory device of claim 1, wherein the row decoder decodes the row address and generates first and second select signals respectively corresponding to the first and second memory blocks.

10. The memory device of claim 9, wherein the column decoder decodes the column address according to the first and second select signals and generates the first and second column select signals of the selected memory block from the first and second memory blocks.

11. The memory device of claim 9, wherein the first and second select signals include main or sub-word line drive signals corresponding to the first and second memory blocks.

12. A memory device comprising:
    first and second memory blocks, each including a memory cell array defined by a sub-word line driver region and a bit line sense amplifier region;
    first and second data transmission lines disposed and extending on an identical row in the bit line sense amplifier region of the memory cell array;
    first and second bit line sense amplifiers disposed in the bit line sense amplifier region of the memory cell array and configured to sense/amplify data of the memory cell array and transmit the data to the first and second data transmission lines, respectively; and
    a sense amplifier driver comprising
        a drive signal generation unit configured to generate first and second drive signals respectively corresponding to the first and second bit line sense amplifiers by combining a bit line sense amplifier enable signal with first and second column select signals, and
        a drive unit configured to provide power line signals to the first and second bit line sense amplifiers in response to the first and second drive signals, respectively,
    wherein the first and second bit line sense amplifiers are selectively enabled according to a column address.

13. The memory device of claim 12, further comprising:
    a row decoder configured to select one of the first and second memory blocks by decoding a row address and enable a word line of the memory cell array included in the selected memory block.

14. The memory device of claim 13, further comprising:
    a column decoder configured to generate, by decoding the column address, the first and second column select signals, which correspond to the first and second data transmission lines of the memory cell array included in the selected memory block.

15. The memory device of claim 14, wherein:
    the sense amplifier driver is configured to drive the first and second bit line sense amplifiers in response to the first and second column select signals and the bit line sense amplifier enable signal.

16. The memory device of claim 14, further comprising: first and second input/output switches disposed in the bit line sense amplifier region and coupled between the first and second data transmission lines and data input/output lines corresponding to the first and second data transmission lines.

17. The memory device of claim 16, wherein the first and second input/output switches respectively couple the first and second data transmission lines to the corresponding data input/output lines in response to the first and second column select signals.

* * * * *